(12) United States Patent
Saitou et al.

(10) Patent No.: US 8,836,457 B2
(45) Date of Patent: Sep. 16, 2014

(54) CONTACTLESS SWITCH STRUCTURE

(75) Inventors: Yoshitane Saitou, Kyoto (JP); Kenji Nishikido, Kyoto (JP)

(73) Assignee: Anywire Corporation, Kyoto (JP)

( * ) Notice: Subject to any disclaimer, the term of this patent is extended or adjusted under 35 U.S.C. 154(b) by 0 days.

(21) Appl. No.: 13/879,680

(22) PCT Filed: Mar. 26, 2011

(86) PCT No.: PCT/JP2011/057485
§ 371 (c)(1),
(2), (4) Date: Apr. 16, 2013

(87) PCT Pub. No.: WO2012/131859
PCT Pub. Date: Oct. 4, 2012

(65) Prior Publication Data
US 2013/0206556 A1    Aug. 15, 2013

(51) Int. Cl.
*H01H 9/00*    (2006.01)
(52) U.S. Cl.
USPC .............................. 335/205; 200/181; 200/553
(58) Field of Classification Search
USPC ....... 335/3, 205, 209, 215; 200/4, 5 A, 302.1, 200/302.3, 6 R, 181, 553; 307/112, 116
See application file for complete search history.

(56) References Cited

U.S. PATENT DOCUMENTS

| | | | | |
|---|---|---|---|---|
| 5,160,918 A | * | 11/1992 | Saposnik et al. | 345/161 |
| 6,109,130 A | * | 8/2000 | Will | 74/470 |
| 6,818,845 B2 | * | 11/2004 | Portmann | 200/302.3 |
| 7,595,712 B2 | * | 9/2009 | Nishino et al. | 335/207 |

FOREIGN PATENT DOCUMENTS

| | | |
|---|---|---|
| JP | 9-161617 | 6/1997 |
| JP | 2009-26509 | 2/2009 |
| JP | 2010-123320 | 6/2010 |

OTHER PUBLICATIONS

International Search Report, mail date is Jun. 21, 2011.

* cited by examiner

*Primary Examiner* — Bernard Rojas
(74) *Attorney, Agent, or Firm* — Greenblum & Bernstein, P.L.C.

(57) ABSTRACT

A contactless switch structure is provided that may turn on and off an electrical signal in a contactless manner, allow a worn operating portion in the structure to be easily replaced, and prevent decrease of the sensitivity caused by foreign material such as dust. A contactless switch structure according to the invention includes a replaceable member to be detachably set to a target portion to which the contactless switch structure is to be set, the replaceable member having an aperture at an end section thereof and a virtual boundary defined by the aperture at the end section; and a detection element and a detector closely opposed across the virtual boundary in the normal state, the detection element and the detector being placed on the replaceable member side and the target portion side of the virtual boundary, respectively.

7 Claims, 8 Drawing Sheets

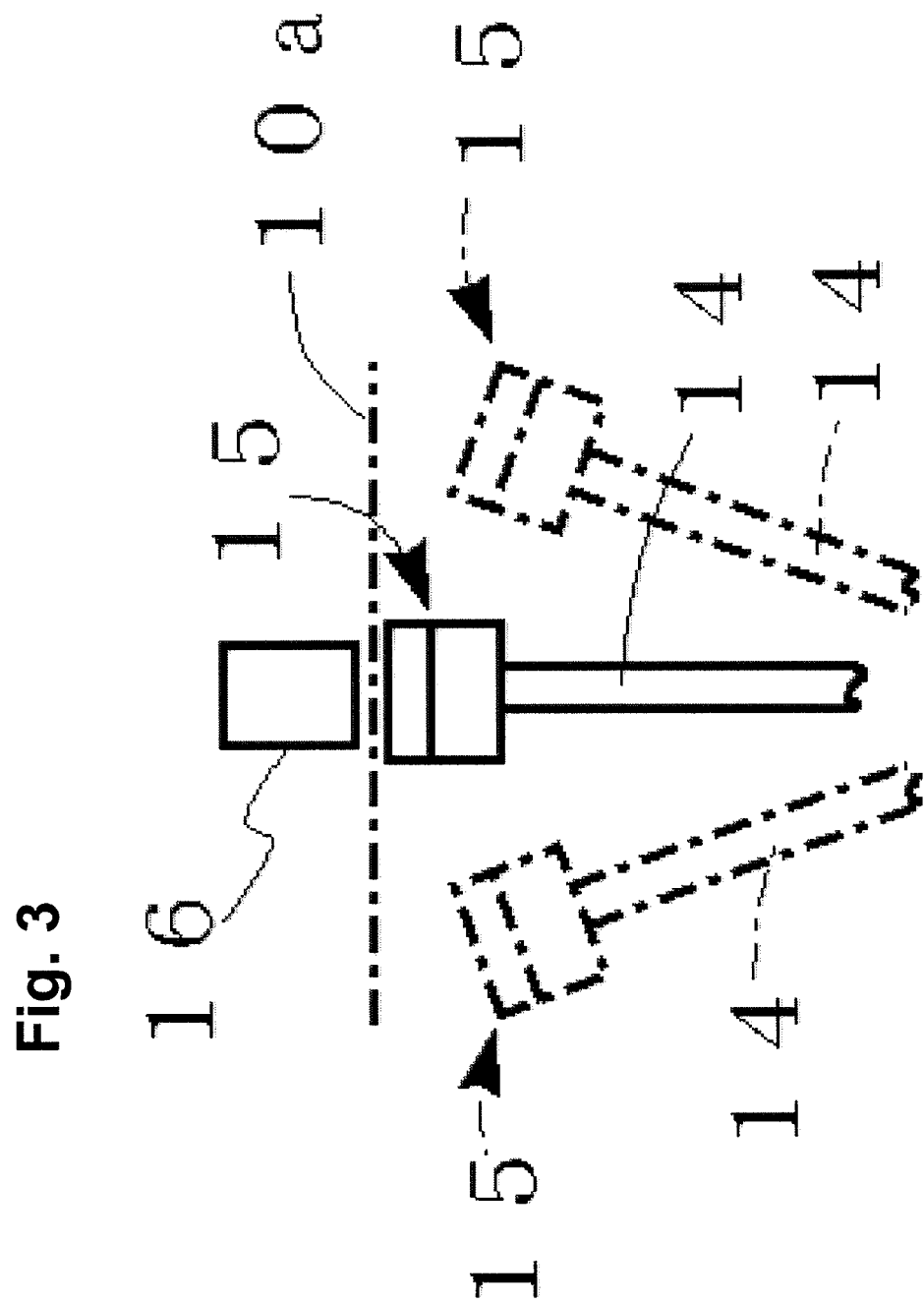

CONTACTLESS SWITCH STRUCTURE

BACKGROUND OF THE INVENTION

1. Field of the Invention

The present invention relates to a contactless switch structure that is suited to an ON/OFF switch performing switching operations between two predetermined actions such as lighting and extinction, or start and stop of an operating instrument, and that is particularly suited to a contactless switch without a plurality of contact points for switching operations.

2. Description of the Related Art

As a device for performing switching operations between two predetermined actions such as lighting and extinction, or start and stop of an operating instrument, an ON/OFF switch is widely used. In addition, recently, a contactless switch without a plurality of contact points for switching operations are widely used. A variety of improvements for the operability of the switch lever in the contactless switch have been attempted. The inventors proposed a contactless ON/OFF switch disclosed in JP2009-26509A. The contactless ON/OFF switch comprises a switch lever that is excellent in user-friendliness and can be tilted in an arbitrary direction. The contactless ON/OFF switch comprises a cylindrical member that has flexibility and stretchability and thus may be freely restored to the normal position. The contactless ON/OFF switch also comprises a base member and a rod member that has flexibility. A first end of the cylindrical member is fixed to the base member. The rod member is inserted into the cylindrical member. A first end of the rod member is fixed to an end portion of the cylindrical member that is not fixed to the base member. A second end of the rod member is protruded from the cylindrical member. When a bending force is directed on the free end (the end fixed to the first end of the rod member) of the cylindrical member, the cylindrical member and the rod member are bent. As a result, the end portion (a moving end portion) of the rod member protruded from the cylindrical member is moved toward the free end along the shaft line of the rod member or is tilted from the shaft line. The movement of the moving end portion of the rod member is the same regardless of the direction of the bending force directed on the free end. Thus, if the movement of the end portion is converted to electrical signal binary and is output, the same output can be obtained, that is, the ON/OFF operation can be provided.

The contactless ON/OFF switch, however, has a problem that care and costs are required for maintenance. For instance, a method of converting the movement of the moving end portion to electrical signal binary particularly prefers to use of reflecting light, but in use of the reflecting light, a decreased amount of the reflecting light leads to a change of the detection level of a light-receiving element. Accordingly, the contactless ON/OFF switch needs to be replaced if the amount of the reflecting light is decreased, thus requiring care and costs for maintenance.

Thus, the inventors further proposed a structure of a switch lever for a contactless ON/OFF switch disclosed in JP2010-123320A. The structure of the switch lever comprises a cylindrical member that has flexibility and stretchability and thus may be freely restored to the normal position. A first end of a rod member is inserted into the cylindrical member and fixed therein. A mirror surface is formed at an end of the rod member that is surrounded by the cylindrical member. A detector is opposed to the mirror surface. The amount of light on the light-receiving element is changed by a slant of the mirror surface formed at the end of the rod member. The detector detects the change on the basis of the amount of light received by the light-receiving element during startup. Namely, the detector resets the standard detection level at every startup. This reduces the affect of the aged deterioration of the mirror surface, thereby improving the durability of the switch. The structure can thus keep the operability that the switch lever can be tilted in any direction, while decreasing the frequency of breakdowns and thus decreasing care and costs required for maintenance.

Patent Literature 1: JP2009-26509A
Patent Literature 2: JP2010-123320A

SUMMARY OF THE INVENTION

Unfortunately, the switch lever structure has a problem that when the rod member is placed in the vertical direction, the detection sensitivity of the detector is decreased or the detector does not function due to dust accumulated on the mirror surface, the dust being induced from the room above the mirror surface. On the other hand, in the contactless ON/OFF switch in which one end of the rod member is inserted into the cylindrical member and is protruded therefrom and the movement of the protruded end is converted to electrical signal binary and is output, the aforementioned problem may be avoided. The ON/OFF switch does not have, however, good removability from the apparatus in which the switch is provided since the protruded end of the rod member must be inserted into the apparatus to convert the movement of the end to electrical signal binary. Therefore, there is a problem that when a cylindrical member having flexibility is worn by repeated strains, the replacement of the cylindrical member requires time and effort.

Thus, an object of the present invention is to provide a contactless switch structure that may turn on and off an electrical signal in a contactless manner, allow a worn operating portion in the structure to be easily replaced, and prevent decrease of the sensitivity caused by foreign material such as dust.

A contactless switch structure according to the present invention comprises a replaceable member to be detachably set to a target portion to which the switch structure is to be set, the replaceable member having an aperture at an end section thereof and a virtual boundary defined by the aperture at the end section; and a detection element and a detector closely opposed across the virtual boundary when the replaceable member is set and in the normal state of the replaceable member, the detection element and the detector being placed on the replaceable member side and the target portion side of the virtual boundary, respectively. The replaceable member comprises a flexible cylindrical member flexible in all directions; a rod member attached to a free end of the flexible cylindrical member; and a rockable member extending from a base end of the rod member toward the end section through the inside of the flexible cylindrical member. The detection element is fixed on a face of the rockable member on the end section side, and when a force is applied to the rod member in a direction perpendicular to the shaft line of the rod member, the detection element moves in an area on the replaceable member side of the virtual boundary in a direction parallel to the virtual boundary.

The detector detects the detection element moving away from the virtual boundary.

In the present invention, the detection element may comprise a magnetic substance if, for example, the detector comprises a magnetic sensor and detects the ON/OFF switch operation using a change of a magnetic force. If the detector comprises a light emitting element and a light-receiving element and detects the ON/OFF switch operation using a change of the amount of light, the detection element may comprise a light reflecting material. Likewise, if the detector comprises an ultrasonic wave emitting element and an ultrasonic wave-receiving element and detects the ON/OFF switch operation using a change of the sound volume, the detection element may comprise a sound reflecting material. Further, if the detector detects the ON/OFF switch operation on the basis of a change in inductance (L), the detection element may comprise a metal. If the detector detects the ON/OFF switch operation on the basis of a change in capacitance (C), the detection element may comprise an electrostatic substance. However, if the detection element comprises a reflective surface and comprises an electrostatic substance and a magnetic metal substance, any detectors may be used regardless of the detection method.

In the present invention, the detection element and the detector are closely opposed in such a way that the detector may detect the movement of the detection element and that the detector is not contact with the detection element. If the detector is in contact with the detection element, the detector may be an obstacle for the movement of the detection element and for the replacement of the replaceable member from the target portion. Therefore, the distance between the detector and the detection element is necessary. However, if the distance is too long, foreign material such as dust will probably exist in the space and the detection sensitivity of the detector will be decreased. Therefore, the distance is preferably as short as possible.

Moreover, the movement of the detection element in a direction parallel to the virtual boundary does not restrict movement in the normal direction. The detection element may move in the normal and parallel directions simultaneously, provided that the detection element does not protrude from the virtual boundary to the target portion side. For example, the detection element may move away from the virtual boundary and the detector, that is, move obliquely with respect to the rod member from the position in the normal state of the replaceable member.

The replaceable member may comprise a holding member holding the detection element or a part of the rockable member at a predetermined position in the normal state of the replaceable member and allowing movement of the detection element.

The shape of the holding member is not restricted, and the holding member may comprise, for example, a flat spiral spring holding the detection element or a part of the rockable member at a predetermined position, or the holding member may comprise a plurality of linear elastic members radially provided in a flat region, the linear elastic members holding the detection element or a part of the rockable member at a predetermined position. In addition, the holding member may comprise a flexible disc holding the detection element or a part of the rockable member at a predetermined position. The flexible disc may comprise a plurality of circular projections in a concentric fashion or comprise a spiral projection.

According to a contactless switch structure of the present invention, the detection element moves in an area on the replaceable member side of the virtual boundary in a direction parallel to the virtual boundary, and the detector detects the detection element moving away from the virtual boundary. Namely, the ON/OFF switch operation may be detected in a contactless manner and thus the electric signal may be turned on and off in a contactless manner. Further, when the rod member attached to the free end of the flexible cylindrical member is operated, the detection element used for the ON/OFF switch operation is rocked from the base end of the rod member as the pivot point, together with the rockable member extending from the base end of the rod member. The range of the movement is restricted in the area on the replaceable member side of the vertical boundary at the end section of the replaceable member (the vertical boundary being the portion defined by the aperture at the end section). In other words, the detection element moves in the area on the replaceable member side of the virtual boundary in a direction parallel to the virtual boundary and thus is not protruded from the vertical boundary. Therefore, the whole replaceable member including a worn portion is easily replaceable since the replaceable member is easily removable from the target portion. Furthermore, the decreasing of the sensitivity caused by foreign material such as dust in the space between the detection element and the detector does not occur because the detection element and the detector, which contribute to the detection of the ON/OFF switch operation, closely opposed via the virtual boundary.

Moreover, if the detection element comprises a reflective surface and comprises an electrostatic substance and a magnetic metal substance, the detection element is available for any detectors such as a detector for a magnetic force, the amount of light, the sound volume, inductance (L), or capacitance (C). Accordingly, the detector is exchangeable irrespective of the detection principle thereof.

Further, a holding member that holds the detection element or a part of the rockable member at a predetermined position in the normal state of the replaceable member makes sure that the detection element and the detector may be closely opposed. This may prevent a malfunction caused by misalignment between the detection element and the detector when the replaceable member is replaced.

BRIEF DESCRIPTION OF THE DRAWINGS

FIG. 3 is a schematic side view showing movements of the detection element.

Figure 1A:
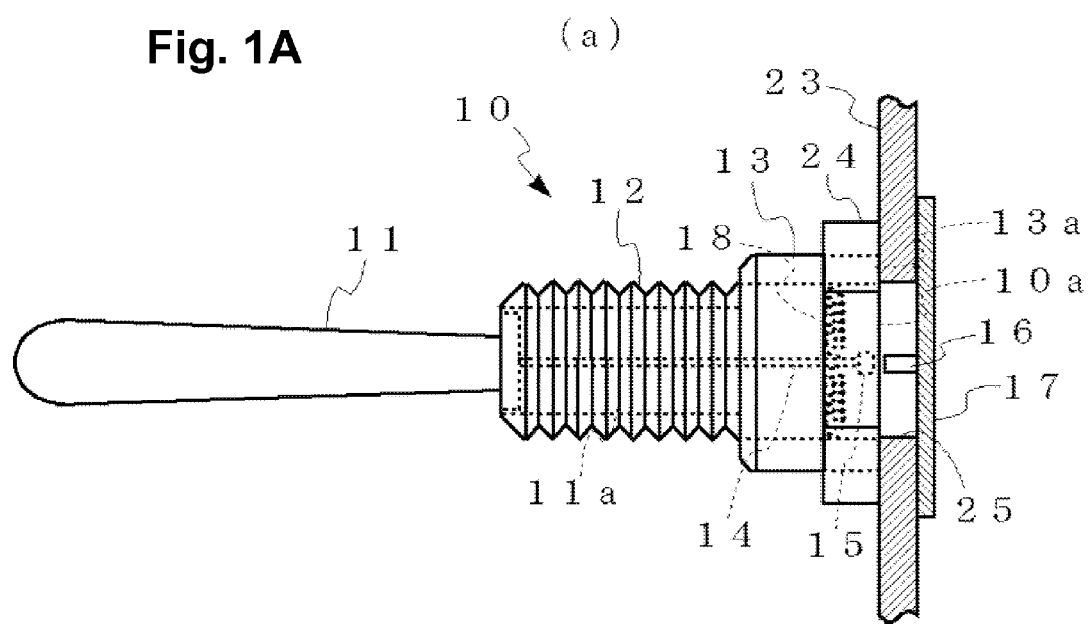
FIG. 1A is a side view showing a contactless switch including a contactless switch structure according to the present invention, and shows a contactless switch in the normal state.

Embodiments of a contactless switch structure of the present invention are described referring to FIGS. 1 to 9. FIG.

5 is an elevation view showing a Picking Terminal (Trade Mark) using a contactless switch including a contactless switch structure of the present invention. A terminal 20 is fixed on a pipe in a shelf comprising a recess under the terminal 20 to accommodate an article. A direction to pick up the article in the recess is performed by lighting of a direction lamp 22 on the terminal 20. When an operator finishing picking the article up operates a switch lever 11, which corresponds to a rod member of the present invention, corresponding information is transmitted to a not-shown control unit. Since the switch lever 11 may be tilted in any directions, the operator tilts it easily and smoothly after picking the article up.

A replaceable member 10 including the switch lever 11 is freely removable from a casing 23 in the terminal 20. When the replaceable member 10 is worn and broken by many operations, the replace member 10 is independently exchangeable to reuse it. A cylindrical connecting member 13 is available in the replaceable member 10 for connection to the casing 23. One end of the cylindrical connecting member 13 is inserted into a not-shown cylindrical projection provided on the casing 23. The cylindrical connecting member 13 is then fastened to the casing 23 with a hexagon cap nut 24. Hereinafter, one end of the cylindrical connecting member 13 close to the casing 23 is a base end, and the other end is a free end, and the same holds true for other members included in the replaceable member 10. A surface 13a of the cylindrical connecting member 13 on the base end side corresponds to an end section of the replaceable member 10, and an aperture on the end section of the cylindrical member 13 is defined as a virtual boundary 10a.

The free end of the cylindrical connecting member 13 is provided with a flexible cylindrical member 12 formed in accordion-like pleats made of rubber. The free end of the flexible cylindrical member 12 is provided with a base end 11a of the switch lever 11. The base end 11a of the switch lever 11 is inserted into the flexible cylindrical member 12, and a rockable member 14 extends therefrom toward the vertical boundary 10a through the inside of the flexible cylindrical member 12. The base end of the rockable member 14 has a detection element 15 that comprises a magnetic metal substance 15b and an electrostatic substance 15c. An end section 15a of the detection element 15 is formed as a reflective surface.

Further, a plurality of springs 18, each spring 18 having one end fixed to the cylindrical connecting member 13, are fixed to the rockable member 14. These springs 18 as a holding member are radially placed around the rockable member 14 in the same flat plane. The holding member may position the detection element 15 in the normal state of the replaceable member 10 in which no force is applied to the switch lever 11, and also allow for movement of the rockable member 14 and the detection element 15 attached thereto when a force is applied to the switch lever 11.

Meanwhile, the undersurface of the cylindrical projection receiving the cylindrical connecting member 13 in the casing 23 has an aperture 25 overlapped with the virtual boundary 10a. A substrate 17 is provided inside the casing 23 over the aperture 25. A detector 16 is provided on the substrate 17 and exposed in the aperture 25. Therefore, when the replaceable member 10 is placed on the casing 23, the detection element 15 and the detector 16 are closely opposed across the virtual boundary 10a in the normal state (as shown in FIG. 1a) in which the switch lever 11 is not operated.

Figure 1B:
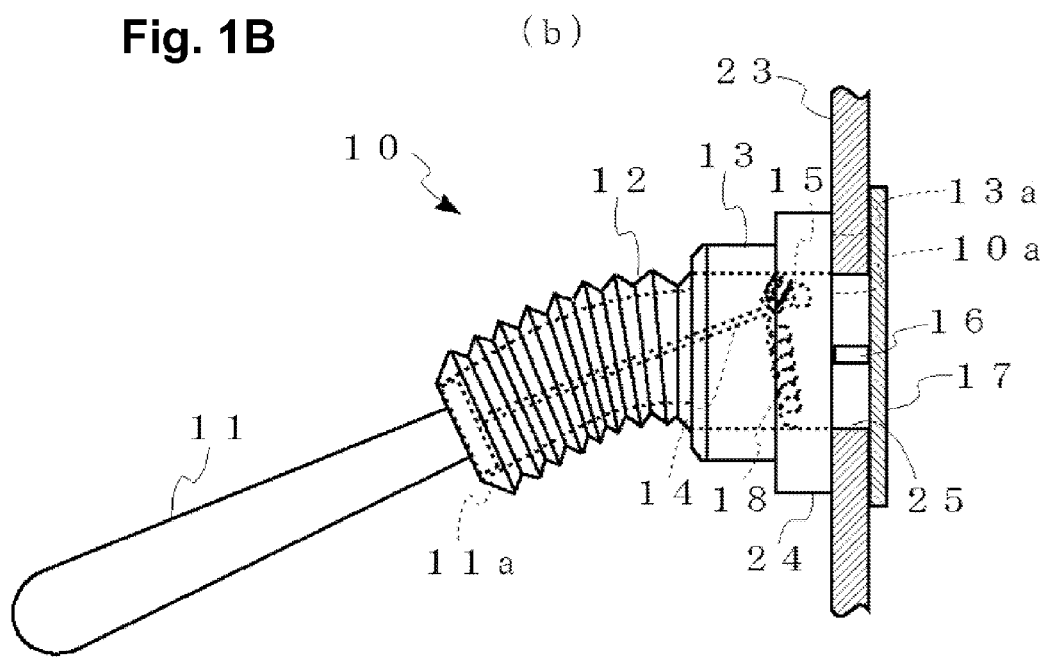
FIG. 1B is another side view showing a contactless switch including a contactless switch structure according to the present invention, and shows a contactless switch in the state of operation.

When a force is applied to the switch lever 11, the shape of the flexible cylindrical member 12 is changed from the shape as shown in FIG. 1a to the shape as shown in FIG. 1b in which the switch lever 11 is tilted. During the change, the rockable member 14 extending from the base end 11a of the switch lever 11 is tilted, and the detection element 15 moves away from the center of the virtual boundary 10a. When the switch lever 11 is placed in the normal position, the detection element 16 is opposed to the detector 15, namely, it overlaps the center of the virtual boundary 10a. Therefore, when the switch lever 11 is tilted, the detection element 16 moves away from the detector 16. The switch structure may then turn on and off the electric signal in a contactless manner by operating the switch lever 11 because the detector 16 may detect the detection element 15 moving away therefrom.

Figure 6:
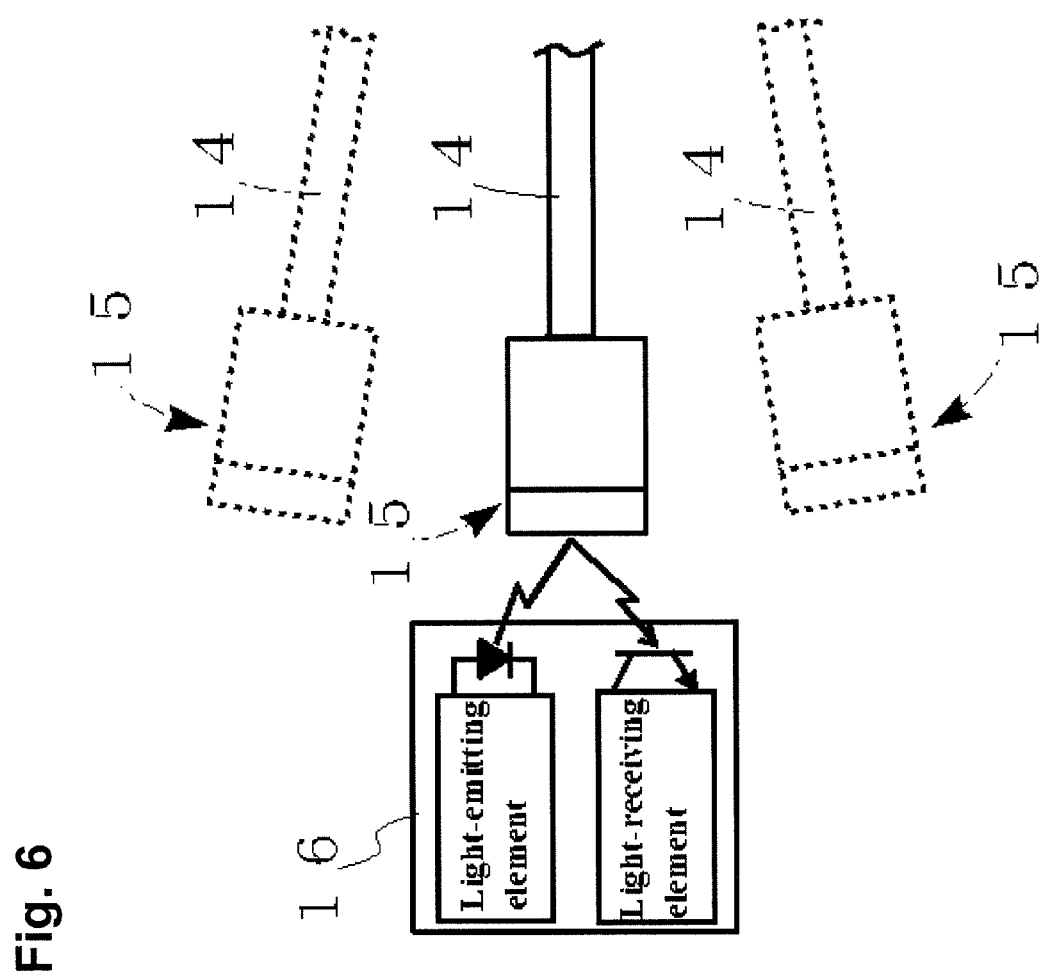
FIG. 6 is a schematic view showing detection on the basis of changes of the amount of light.
Figure 7:
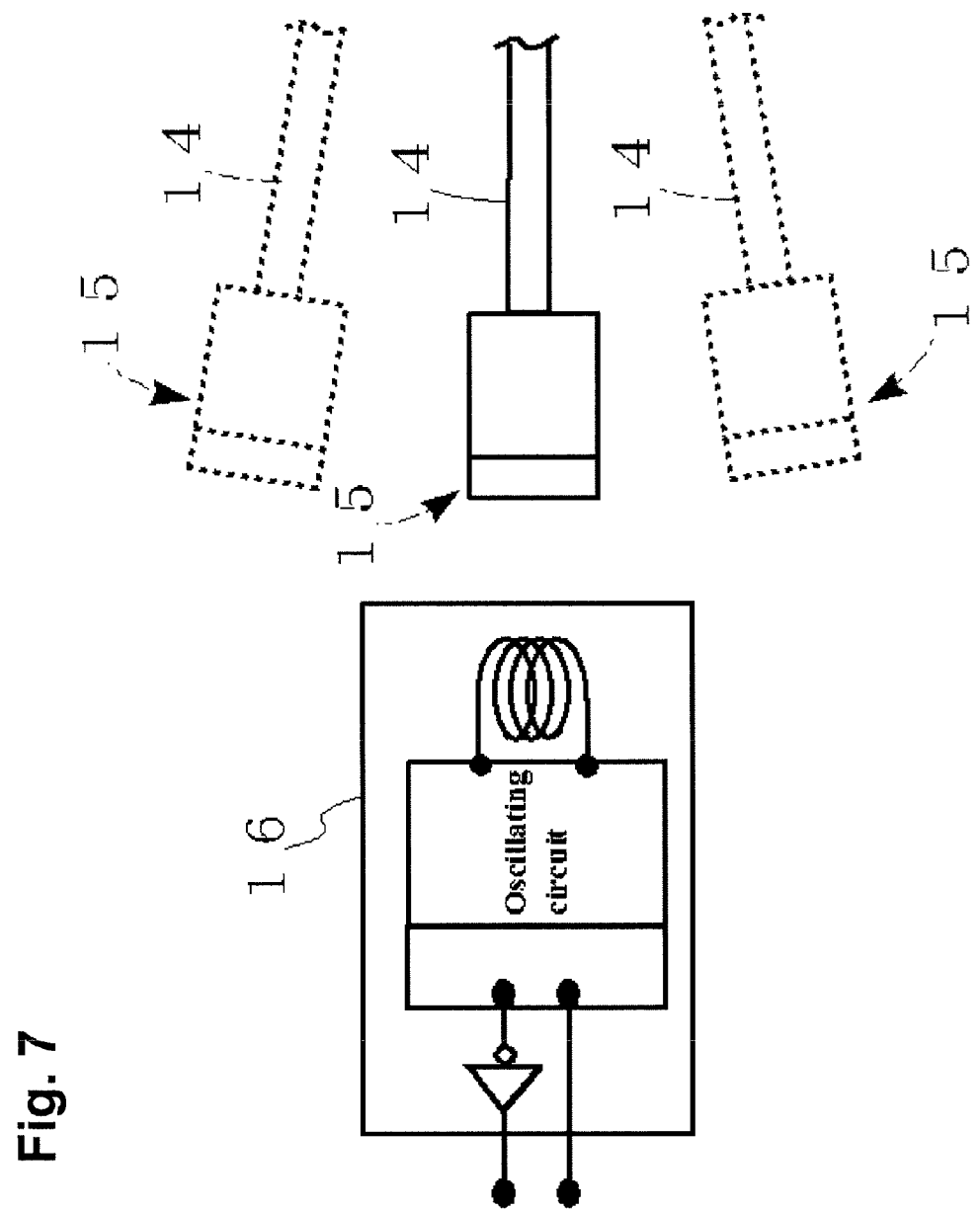
FIG. 7 is a schematic view showing detection on the basis of changes of inductance (L).

A method of detecting the detection element 15 moving away from the detector 16 is not restricted, changes of magnetic force, the amount of light, sound volume, inductance (L) and capacitance (C) may be used. More specifically, if the detector 16 comprises a magnetic sensor, the detector 16 may detect the detection element 15 moving away by the change of a magnetic force from the detection element 15 including the magnetic metal substance 15b. If the detector 16 comprises a light emitting element and a light-receiving element as shown in FIG. 6, light from the light emitting element is reflected with the reflective surface 15a on the detection element 15. Therefore, the detector 16 may detect the detection element 15 moving away by the change of the amount of light received on the light-receiving element. Likewise, if the detector 16 comprises an ultrasonic wave emitting element and an ultrasonic wave-receiving element, which are both not shown, ultrasonic waves from the ultrasonic wave emitting element are reflected by the reflective surface 15a of the detection element 15. Therefore, the detector 16 may detect the detection element 15 moving away by the change of the amount of ultrasonic waves received on the ultrasonic wave-receiving element. Further, if the detector 16 comprises a proximity sensor, the detector 16 may detect the detection element 15 moving away by the change of inductance (L) induced from the magnetic metal substance 15b in the detection element 15 as shown in FIG. 7. Furthermore, although not shown, if the detector 16 comprises a capacitance (C) sensor, the detector 16 may detect the detection element 15 moving away by the change of capacitance (C) induced from the electrostatic substance 15c in the detection element 15.

Figure 2A:
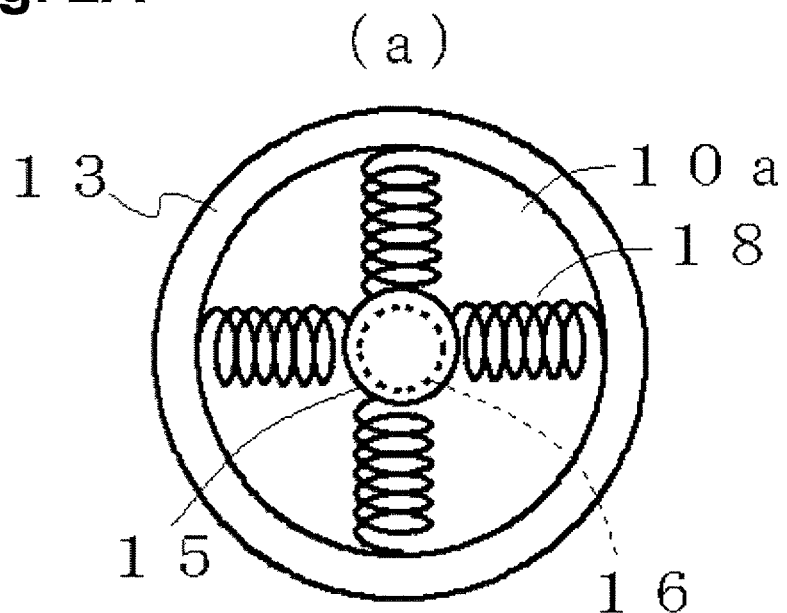
FIG. 2A is a schematic view showing movement of a detection element with respect to a virtual boundary of a replaceable member and is a plan view showing the state of the normal position.
Figure 2B:
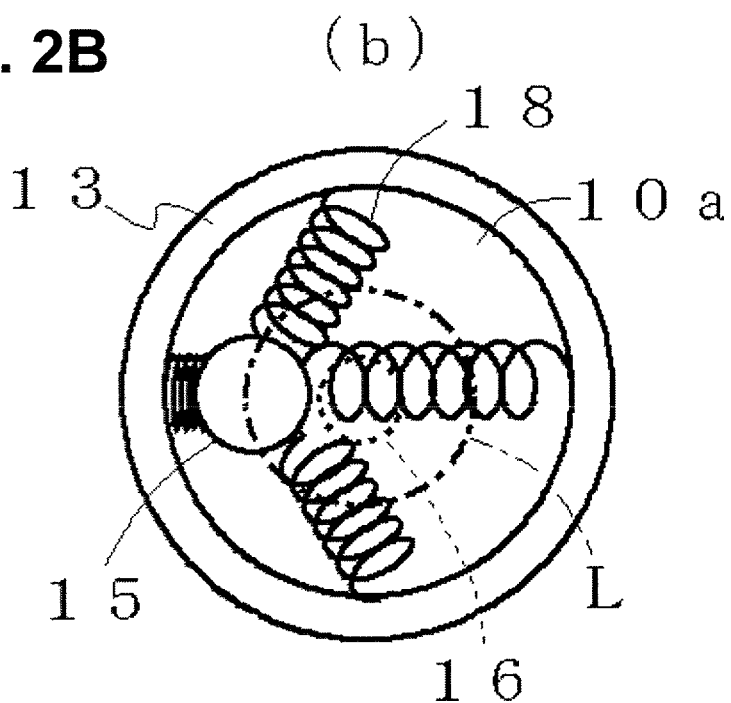
FIG. 2B is another schematic view showing movement of a detection element with respect to a virtual boundary of a replaceable member and is a plan view showing an operation when a force is applied to a rod member in a direction perpendicular to the shaft line of the rod member.
Figure 4:
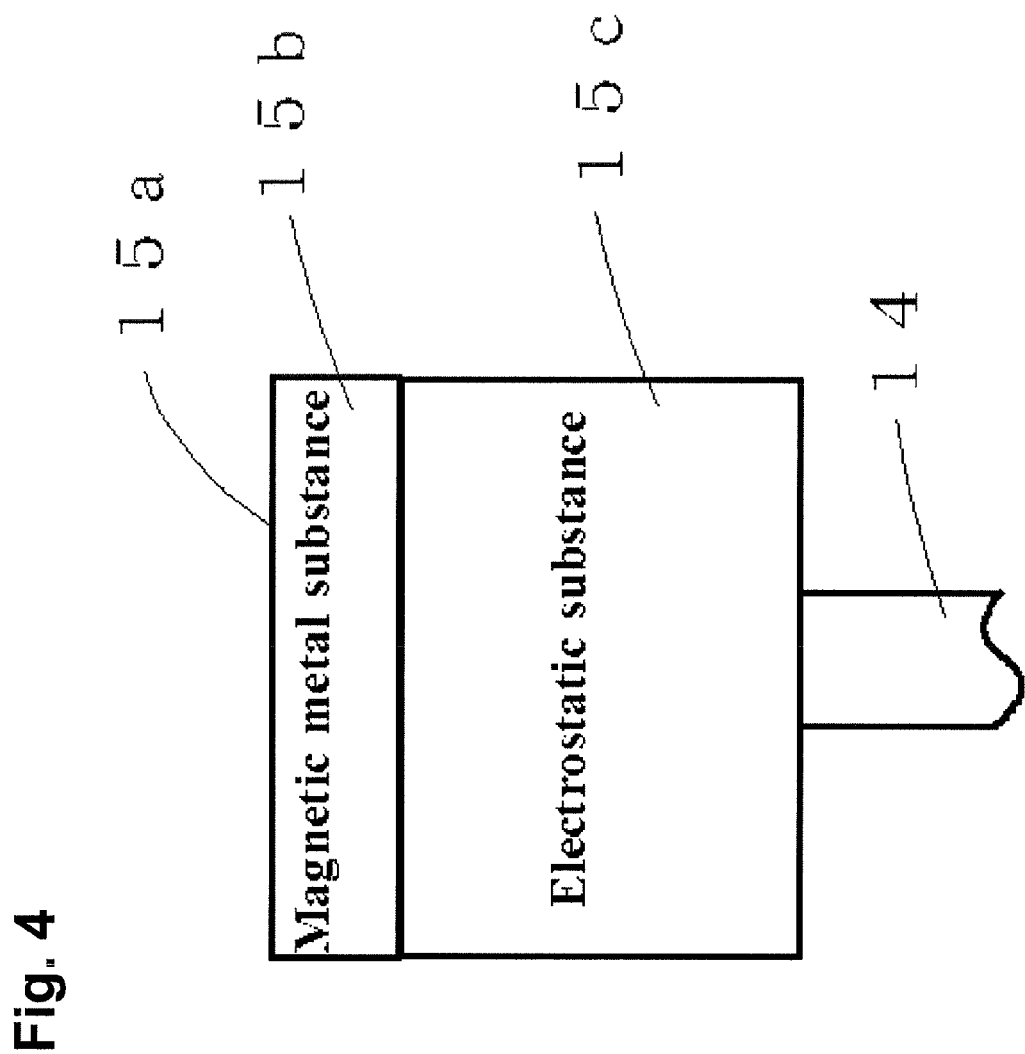
FIG. 4 is a schematic view showing components of the detection element.
Figure 5:
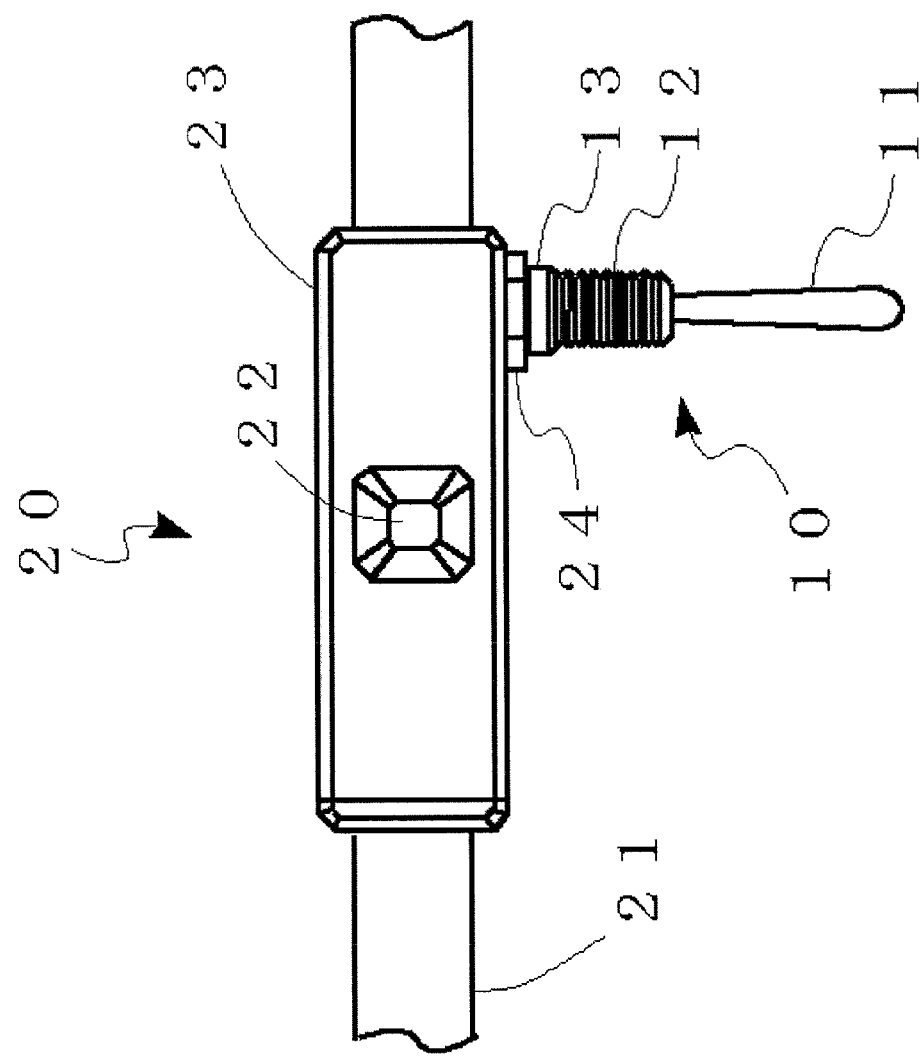
FIG. 5 is an elevation view showing a Picking Terminal (Trade Mark) using a contactless switch including a contactless switch structure of the present invention.

When the switch lever 11 is tilted to the maximum angle, the detection element 15 moves to the farthest position from the center of the virtual boundary 10a. The moving passage (L) of the movement of the detection element 15 is then a circle concentric with the virtual boundary 10a as shown in FIG. 2b. The detection element 15 on the moving passage (L) moves away from the virtual boundary 10a toward the free end as shown in FIG. 3 (downward in FIG. 3). Namely, the detection element 15 does not protrude from the virtual boundary 10a toward the casing side (upward in FIG. 3). Accordingly, the replaceable member 10 is easily removable from the casing 23.

The component of the flexible cylindrical member 12 is not limited and may be made of any material that is flexible. A synthetic resin may be used. An accordion-like shape may be provided if necessary. A component of the cylindrical connecting member 13 is not limited and may be made of any material that is stiffer than that of the flexible cylindrical member 12. A synthetic resin may be used.

Figure 8:
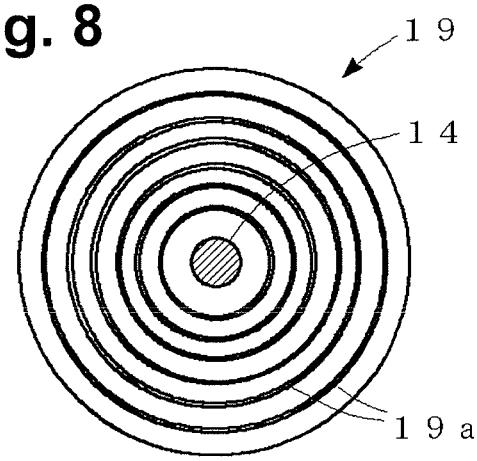
FIG. 8 is a plan view showing a flexible disc comprised in a holding member.
Figure 9:
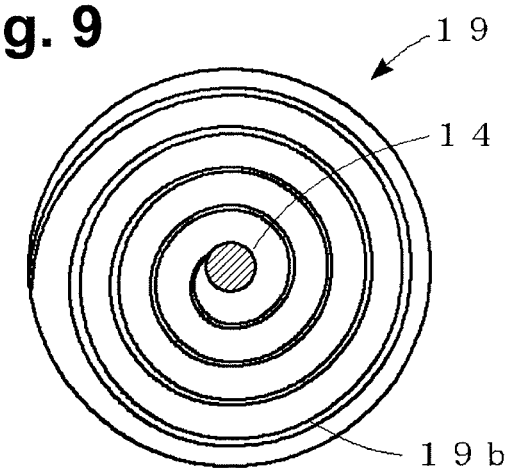
FIG. 9 is a plan view showing a flexible disc comprised in a holding member according to another embodiment.

The component of the holding member comprising the springs 18 is not limited and may be made of any material that may hold the detection element 15 or a part of the rockable member 14 at a predetermined position in the normal state of the rockable member 10 and allow the movement of the detection element 15. The springs 18 may be replaced with flat spiral springs or a flexible disc as shown in FIGS. 8 and 9. The flexible disc may comprise a plurality of circular projections 19a in a concentric fashion as shown in FIG. 8 or a spiral projection 19b as shown in FIG. 9. Further, the holding position of the rockable member 14 may be changed if appropriate. The detection element 15 may be held instead of the rockable member 14. Furthermore, the holding position of a part of the rockable member 14 or the detection element 15 may be displaced from the shaft line of the cylindrical connecting member 13.

What is claimed is:

1. A switch structure comprising:
    a replaceable member to be detachably set to a target portion to which the switch structure is to be set, the replaceable member having an aperture at an end section thereof and a virtual boundary defined by the aperture at the end section; and
    a detection element and a detector closely opposed across the virtual boundary when the replaceable member is set and in the normal state of the replaceable member, the detection element and the detector being placed on the replaceable member side and the target portion side of the virtual boundary, respectively, wherein
    the replaceable member comprises
    a flexible cylindrical member flexible in all directions;
    a rod member attached to a free end of the flexible cylindrical member; and
    a rockable member extending from a base end of the rod member toward the end section through the inside of the flexible cylindrical member;
    wherein
    the detection element comprises a reflective surface and comprises an electrostatic substance and a magnetic metal substance,
    wherein
    the detection element is fixed on a face of the rockable member on the end section side, and when a force is applied to the rod member in a direction perpendicular to the shaft line of the rod member, the detection element moves in an area on the replaceable member side of the virtual boundary in a direction parallel to the virtual boundary,
    and wherein
    the detector detects the detection element moving away from the virtual boundary.

2. The switch structure according to claim 1, wherein the replaceable member comprises a holding member holding the detection element or a part of the rockable member at a predetermined position in the normal state of the replaceable member and allowing movement of the detection element.

3. The switch structure according to claim 2, wherein the holding member comprises a flat spiral spring holding the detection element or a part of the rockable member at a predetermined position.

4. The switch structure according to claim 2, wherein the holding member comprises a plurality of linear elastic members radially provided in a flat region, the linear elastic members holding the detection element or a part of the rockable member at a predetermined position.

5. The switch structure according to claim 2, wherein the holding member comprises a flexible disc holding the detection element or a part of the rockable member at a predetermined position.

6. The switch structure according to claim 5, wherein the flexible disc comprises a plurality of circular projections in a concentric fashion.

7. The switch structure according to claim 5, wherein the flexible disc comprises a spiral projection.

* * * * *